United States Patent
Baiocchi et al.

(10) Patent No.: US 8,101,871 B2
(45) Date of Patent: Jan. 24, 2012

(54) ALUMINUM BOND PADS WITH ENHANCED WIRE BOND STABILITY

(75) Inventors: Frank A. Baiocchi, Allentown, PA (US); John M DeLucca, Wayne, PA (US); John W. Osenbach, Kutztown, PA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/471,982

(22) Filed: May 26, 2009

(65) Prior Publication Data

US 2010/0300741 A1    Dec. 2, 2010

(51) Int. Cl.
*H05K 1/11* (2006.01)

(52) U.S. Cl. ........ 174/261; 257/757; 257/765; 257/766; 257/771; 257/768

(58) Field of Classification Search ........... 174/261; 257/757, 765, 766, 771, 768
See application file for complete search history.

(56) References Cited

U.S. PATENT DOCUMENTS

| | | | |
|---|---|---|---|
| 4,912,544 A | 3/1990 | Onuki et al. | |
| 5,298,793 A | 3/1994 | Kotani et al. | |
| 5,821,627 A * | 10/1998 | Mori et al. | 257/780 |
| 6,426,565 B1 * | 7/2002 | Bhatt et al. | 257/783 |
| 6,670,698 B1 * | 12/2003 | Glenn et al. | 257/678 |
| 7,205,673 B1 | 4/2007 | Pallinti et al. | |
| 2002/0047216 A1 * | 4/2002 | Jiang et al. | 257/778 |
| 2004/0124545 A1 * | 7/2004 | Wang | 257/784 |
| 2005/0073057 A1 | 4/2005 | Tiziani et al. | |
| 2007/0102812 A1 | 5/2007 | Sun et al. | |
| 2009/0102030 A1 * | 4/2009 | Khan et al. | 257/675 |

FOREIGN PATENT DOCUMENTS

| | | |
|---|---|---|
| DE | 102008020327 A1 | 7/2009 |
| JP | 6015958 A | 1/1985 |
| JP | 6122659 A | 1/1986 |

OTHER PUBLICATIONS

Yoshikawa, Kazuki, et al.; "Study of Ni-P/Pd/Au as a Final Finish for Silicon Wafers"; Uyemura Library; http://uyemura.com/library-6.htm; 9 Pages.

* cited by examiner

*Primary Examiner* — Yuriy Semenenko
*Assistant Examiner* — Andargie M Aychillhum

(57) ABSTRACT

An electronic device bond pad includes an Al layer located over an electronic device substrate. The Al layer includes an intrinsic group 10 metal located therein.

27 Claims, 3 Drawing Sheets

ALUMINUM BOND PADS WITH ENHANCED WIRE BOND STABILITY

TECHNICAL FIELD

This application is directed, in general, to electronic packaging, and more specifically to gold wire bonding.

BACKGROUND

An integrated circuit die is commonly electrically connected to a package lead by a gold wire bonded to the package lead and an Al bond pad on the die. The wire bonding process, sometimes called thermosonic bonding, typically uses a combination of pressure and ultrasonic energy to form a metallurgical bond between the gold wire and the Al bond pad.

SUMMARY

One aspect provides an electronic device bond pad that includes an Al layer located over an electronic device substrate. The Al layer includes an intrinsic group 10 metal located therein.

Another aspect provides a method of forming an electronic device bond pad. The method includes providing an electronic device substrate. An Al bond pad is placed over the substrate. An intrinsic group 10 metal is incorporated into the Al bond pad.

BRIEF DESCRIPTION

Reference is now made to the following descriptions taken in conjunction with the accompanying drawings, in which.

DETAILED DESCRIPTION

Thermosonic bonding of a gold (Au) wire directly to an aluminum (Al) bond pad typically forms an intermetallic compound (IMC) region between the Au wire and the Al bond pad. The IMC region includes, e.g., Au and Al. The thermodynamic system that includes the Au wire, the IMC, and the Al pad is not at equilibrium. Thus, atoms within the system may diffuse over time by various diffusion pathways to lower the free energy of the system, sometimes forming voids. The voids weaken the wire bond and may lead to failure of the bond and the device associated with the bond pad.

To reduce void formation, conventional Au wire may be alloyed with about 1 wt % Pd. However, the Pd increases the stiffness of the Au wire, which complicates the wire bond process and may reduce reliability by other mechanisms.

It is presently recognized that void formation may be reduced or substantially prevented by forming an Al bond pad that includes an intrinsic group 10 metal within the bond pad. A group 10 metal is one or more of the elements Ni, Pd, or Pt in group 10 of the periodic table (IUPAC recommended nomenclature). The group 10 metal is intrinsic when it originates from within the bond pad, but not from the Au wire, as described in various embodiments below.

The group 10 metal provided by the Al pad may concentrate over time in or near the IMC region formed by the thermosonic process, inhibiting void formation. Advantageously, however, Au wire may be used that does not contain Pd or other group 10 metal. The Pd-free Au wire is more compliant than the Au—Pd alloy wire. The more compliant wire is easier to process during wire bonding operations, easing the burden on the manufacturer and resulting in more reliable wire bond connections.

Figure 1:
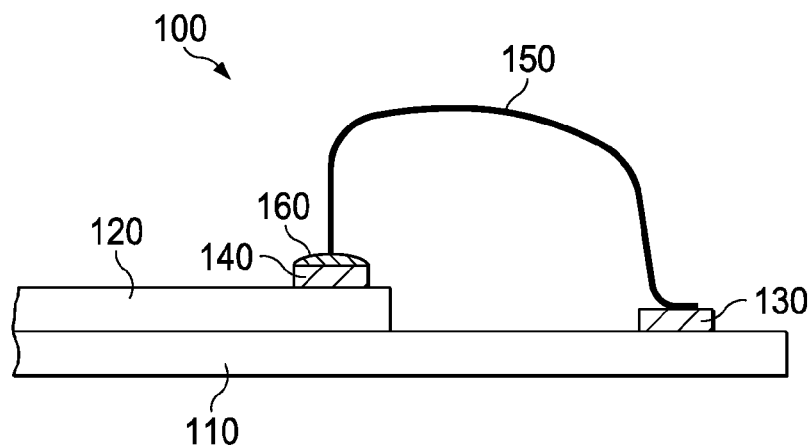
FIG. 1 illustrates an electronic device bond pad connected to a package pad by a bond wire.

Turning initially to FIG. 1, illustrated is a packaged electronic device 100. The device 100 includes a package substrate 110 and a device substrate 120. The substrate 120 may be, e.g., an integrated circuit on a semiconductor substrate. The package substrate 110 has a lead pad 130, and the substrate 120 has a bond pad 140 formed thereover. The bond pad 140 is an Al layer that includes Al and an intrinsic group 10 metal distributed therein as described in detail below. As used herein and in the claims, an Al layer is a layer including at least about 50 wt % Al. The Al layer may include elemental Al, one or more alloys of Al, or one or more intermetallic compounds of Al. An Au wire 150 connects the lead pad 130 to the bond pad 140. The connection may be formed, e.g., by a thermosonic wire bond process. The wire bond process may be conventional. Thus, e.g., the bond may be formed by a combination of heat, pressure, and ultrasonic energy for a preselected duration. The wire bonding process produces an Au ball 160 that forms an electrical and metallurgical connection to the bond pad 140.

Figure 2A:
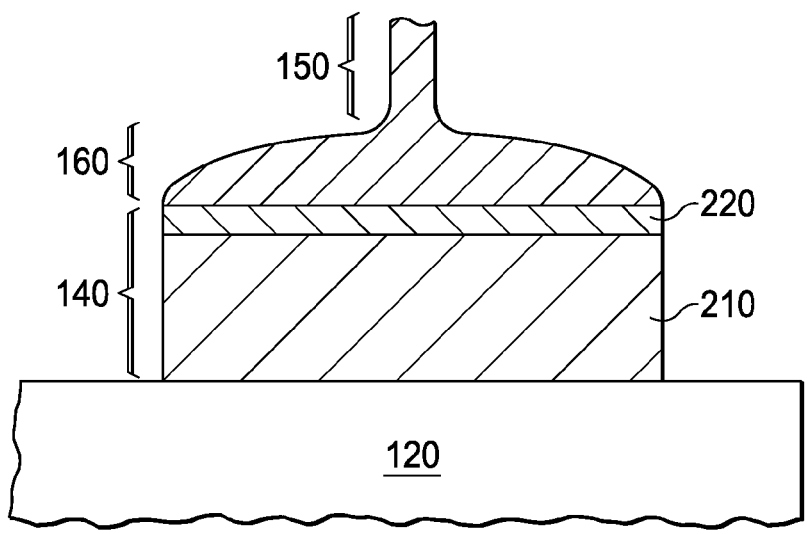
FIGS. 2A-2C illustrate a ball bond located over a bond pad of the disclosure, with a layer including a group 10 metal located therebetween.

FIG. 2A illustrates the bond pad 140 formed according to the disclosure with the ball 160 formed thereover. The bond pad 140 initially includes a layer 210 that may be formed according to the embodiments described herein, e.g., an alloy of Al and a group 10 metal. The bonding process forms an IMC region 220 located between the ball 160 and the layer 210. At least a portion of the group 10 metal is incorporated into the IMC region 220 during the bonding process. Because the group 10 metal in the IMC region originates from the bond pad 140, but not from the bond wire as found in conventional processes, the group 10 metal is an intrinsic group 10 metal. As such, the above-described problems associated with the conventional process can be avoided.

Figure 2B:
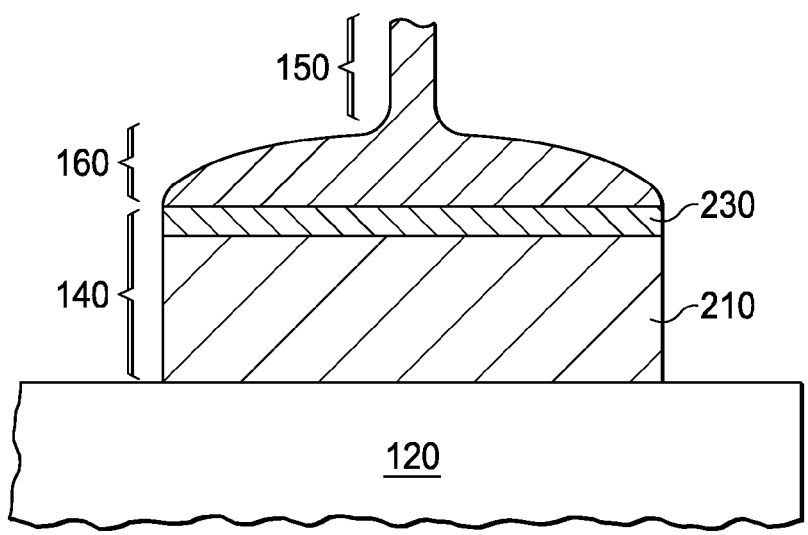

FIG. 2B illustrates the bond pad 140 after aging, e.g., a sufficient period of time after formation of the Au bond that various atomic species have diffused from their initial locations. The thermodynamic system of the bond pad 140, the ball 160, and the IMC region 220 is generally not in equilibrium immediately after the wire bond process forms the IMC region 220. Au readily diffuses into the Al bond pad 140 to form IMCs including Au and Al, e.g., $Al_2Au_5$ and $Al_2Au$. In many cases, the solubility of the group 10 metal is lower in a particular IMC than in Al. Thus, as the Au diffuses into the bond pad 140, a portion of the group 10 metal is concentrated in an IMC region 230 between the ball 160 and the layer 210. The bond pad 140 may thereby be transformed from an alloy of Al and the group 10 metal to an IMC region of Al/Au IMCs with a portion of the group 10 metal that was originally present in the bond pad 140 remaining distributed therein. The presence of the IMC region 230, rich in the group 10 metal relative to the layer 210 and the ball 160, is thought to inhibit void formation as the bond pad 140 and ball 160 age. In some embodiments, the IMC region 230 includes at least about 50 wt % of the group 10 metal. The reduction or absence of voids is expected to significantly reduce the probability of wire bond failure in operational circuits employing embodiments within the scope of the disclosure, thereby increasing device reliability and lifetime.

In some embodiments, the bond pad 140 comprises an average concentration of the group 10 metal in a range from about 0.1 wt % to about 35 wt %. The lower limit is a value below which it is believed an insufficient amount of the group 10 metal will be incorporated into the IMC region 230 to confer a benefit. The upper limit is associated with a quantity above which bonding of the wire 150 to the bond pad 140 may become difficult due to, e.g., increased hardness of the bond pad 140. In some cases, an average concentration of the group 10 metal in the bond pad may be in a range of about 0.5 wt % to about 12 wt %, e.g., to reduce variation of properties of the bond pad 140 at the extreme limits of the range. In some cases, the average concentration of the group 10 metal may be in a range of about 1 wt % to about 8 wt %. This narrower range is thought to reduce any risks associated with the maximum and minimum values of the larger ranges, while providing a comfortable process margin.

Figure 2C:
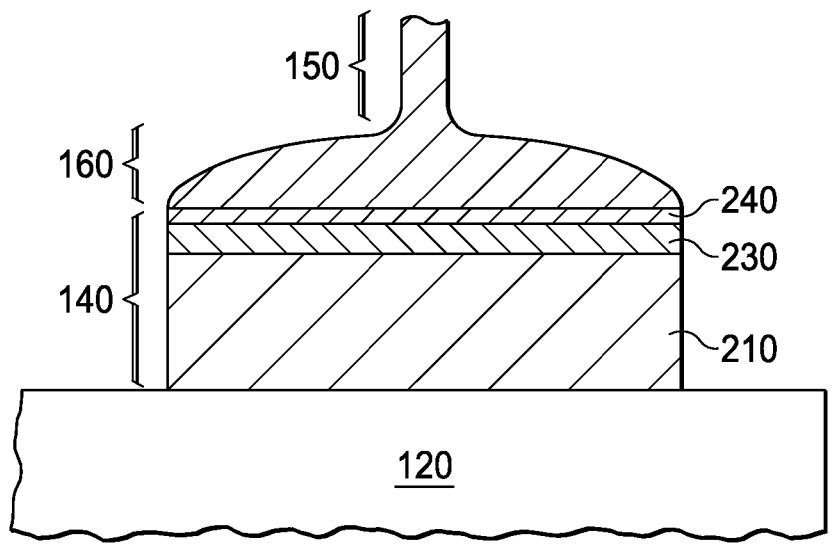

FIG. 2C illustrates the bond pad 140 and the ball 160, with an IMC region 240 located between the IMC region 230 and the ball 160. The IMC region 240 is an IMC region having a lower concentration of the group 10 metal therein than is present in the IMC region 230. In some cases, the thermodynamics of the system including the layer 210, the ball 160 and the IMC region 240 result in the IMC region 230 being located between two regions having a lower concentration of the group 10 metal. Thus, in the illustrated embodiment, the peak concentration of the group 10 metal is located in the IMC region 230, i.e., between the IMC region 240 and the layer 210. In such cases, the ball 160 may not directly contact the IMC region 230.

In some embodiments, the wire 150 is at least about 99.99 wt % Au. When the wire 150 is 99.99 wt % Au, it is sometimes referred to as "4 nines" or "4N." In some cases, the wire 150 and/or ball 160 are essentially free of a group 10 metal, including Pd. "Essentially free of a group 10 metal" means having a total concentration of all group 10 metals less than about 0.01 wt %. Thus, essentially all of the group 10 metal present in the bond pad 140 is intrinsic group 10 metal.

Figure 3:
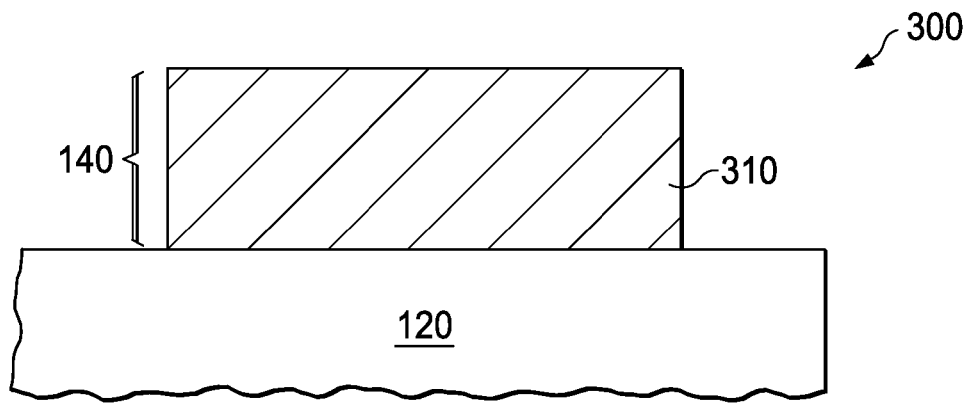
FIG. 3 illustrates a bond pad of the disclosure in which an Al layer is uniformly doped with a group 10 metal.

FIG. 3 illustrates one embodiment of the bond pad 140, generally designated 300, formed in accordance with the disclosure, before wire bonding. The bond pad 140 is formed from a layer 310 located over the substrate 120. The layer 310 is a homogeneous Al alloy that includes a group 10 metal, e.g., the group 10 metal is about uniformly distributed in the bond pad 140. In this context, uniformity is over a distance scale on the order of tens of nm, so localized areas enriched in the group 10 metal such as grain boundaries and dendrites do not render the distribution of the group 10 metal nonuniform. A portion of the homogeneously distributed group 10 metal is expected to concentrate to form the IMC region 230, e.g., after wire bonding and aging as previously described. A portion of the group 10 metal is expected to remain in the layer 310. Thus the remaining portion is located below the IMC region 230. The layer 310 may optionally include one or more alloying metals other than group 10 metals in concentrations of a few wt % or less. For example, about 0.5% Cu is commonly included to reduce hillock formation.

The layer 310 may be formed, e.g., by physical vapor deposition (PVD) or evaporation followed by conventional pattern and etch to form the bond pad 140. In the case of a PVD process, a metal target may be used that includes Al and the group 10 metal in the concentration desired in the layer 310. An evaporation process may be similarly configured to produce the desired alloy of Al and the group 10 metal. Specific process parameters typically depend on manufacturer-specific or device-specific process integration factors. One skilled in the pertinent art may determine a suitable process compatible with a particular manufacturer's process flow.

Figure 4:
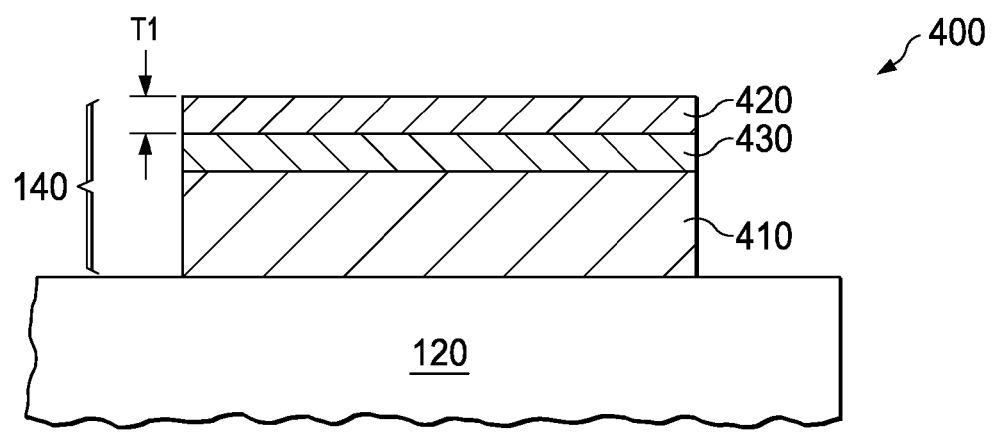
FIG. 4 illustrates a bond pad of the disclosure in which a layer including a group 10 metal is located between an upper and a lower Al layer.

FIG. 4 illustrates another embodiment, generally designated 400, of the bond pad 140 formed according to the disclosure. A lower Al layer 410 comprises Al, but is essentially free of a group 10 metal. In some embodiments, the layer 410 comprises at least about 99 wt % Al. The layer 410 may optionally include alloying elements to, e.g., suppress hillocks. An upper layer 420 over the layer 410 also comprises Al, which may be the same alloy as that used in the layer 410, but need not be.

A metal layer 430 that is a concentrated layer of a group 10 metal is located between the lower and upper layers 410, 420. As described previously, the group 10 metal may diffuse to a location in the bond pad 140 that advantageously suppresses voids. The layer 430 may be configured to provide a desired quantity of the group 10 metal, or to provide a concentration of the group 10 metal within the bond pad 140. The layer 430 may be a substantially pure (e.g., greater than about 99 wt %) group 10 metal, an alloy of two or more group 10 metals, or include a metal that is not a group 10 metal. The layer 430 may even include two or more sub-layers therein, such as a layer of Ni and a layer of Pd. However, unlike some conventional bond pad structures, the bond pad 140 presents Al at its upper surface, since the layer 420 includes Al.

In the embodiment 400, the bond pad 140 may be formed by deposition of the layer 410, e.g., an Al composition including any desired impurities, followed by deposition of the layer 430, on which the layer 420 with an Al composition is formed. Conventional PVD or evaporation may be used for each layer. In some embodiments, a two-chamber deposition tool is used, in which the Al composition is deposited in one chamber, and the group 10 metal is deposited in another chamber.

The layer 410 may be formed by, e.g., PVD or evaporation. In one embodiment, a PVD process in a first deposition chamber under vacuum forms the layer 410 having a desired Al composition. The PVD process may be, e.g., a conventional process using process parameters determinable by one skilled in the pertinent art. The substrate 120 is transferred to a second deposition chamber without breaking vacuum, where a PVD process forms the layer 430 with a group 10 metal composition. The substrate 120 is then transferred back to the first deposition chamber without breaking vacuum, where a PVD process forms the layer 420 with the desired Al composition. In this manner, incorporated ambient impurities in the bond pad 140 are minimized. However, embodiments in which vacuum is broken, e.g., the layer 410 or layer 430 is exposed to the ambient before deposition of the overlying layer, are within the scope of the disclosure.

After forming the desired metal layer stack, the stack may be patterned and etched to form the bond pad 140. In some cases, a dry (plasma) etch process may be used. The process may use conventional plasma etch steps. In some cases, a single conventional etch process may be used to etch the entire metal stack consisting of the layer 410, 420, 430. For example, a plasma process optimized for Al etch may physically sputter the group 10 metal when the layer 430 is sufficiently thin. Such an etch process is typically selective to the substrate 120, thereby minimizing removal of material therefrom. Depending on the thickness and composition of the layer 430, the plasma etch may require multiple steps using different etch chemistry optimized to remove the Al composition of the layers 410, 420 and the group 10 metal composition of the layer 430. In a nonlimiting example, the layers 410, 420 may be removed by a $Cl_2/BCl_3$ plasma. A $CF_4/O_2$ passivation step may be used, e.g., to removed an underlying TiN barrier. The layer 430 may be removed, e.g., by a $Cl_2/Ar$ or $Cl_2/SF6$ plasma.

In some embodiments, a conventional wet etch may be used to remove the layers 410, 420, the group 10 metal composition of the layer 430, or both. For example, a 3:1 HCl:$HNO_3$ etch may remove the layer 430, while a PAN etch may remove the layers 410, 420. Those skilled in the pertinent art are capable of determining a suitable etch process with knowledge of the specific thicknesses and compositions of the various layers of the bond pad 140.

The steps of forming the layer 430 and the layer 420 may be repeated in some cases. Thus, for example, the bond pad 140 may include the layer 410, over which alternating layers of a group 10 metal and an Al layer are located. In some cases such a configuration may suppress voids more effectively than embodiments using a single group 10 metal layer by, e.g., placing the group 10 metal at a more efficacious position within the bond pad 140.

In some embodiments, the layer 430 has a thickness in a range of about 10 nm to about 200 nm. At a thickness less than about 10 nm, there may be an insufficient amount of the group 10 metal to confer a benefit in some cases. At a thickness greater than about 200 nm, the bond pad 140 may be too hard to form a reliable bond thereto. In a non-limiting example, the layer 410 is Al with a thickness of about 400 nm, and the layer 430 is Pd with a thickness of about 34 nm. In this case, the bond pad 140 has an overall concentration of Pd of about 10 wt %.

In general, it is expected that only a portion of the group 10 metal provided by the layer 430 concentrates in the IMC region 230. Moreover, the IMC region 230 is generally expected to be a ternary IMC or alloy including Al, Au and the group 10 metal. Thus, the concentration of the group 10 metal in the IMC region 230 is expected to be less than 100 wt %. The concentration may be substantially less, e.g., 20 wt %. The group 10 metal in other portions of the bond pad 140 is generally expected to be uninvolved in suppressing voids.

In some embodiments, the layer 420 has a thickness in a range of about 10 nm to about 200 nm. In some cases, when the layer 420 has a thickness less than 10 nm, it may be difficult to bond to the bond pad 140, as the surface may more closely resemble a group 10 metal surface. On the other hand, a thickness of 200 nm is thought, e.g., to provide sufficient Al to form an Au/Al IMC region, thus forming a mechanically strong bond between the bond pad 140 and the wire 150.

It is thought that an IMC region formed by the wire 150 and the layer 420 will consume most of the Al therein, thus placing the IMC region close to or directly contacting the group 10 metal layer 430. In some cases, this configuration is expected to position the layer 430 relative to the IMC region formed by the wire bond process such that the group 10 metal may rapidly diffuse to a location at which it suppresses void formation. On the other hand, even if the group 10 metal is consumed in the IMC, or if unreacted Al remains between the IMC layer and the layer 430, embodiments within the scope of the disclosure are expected to benefit from the diffusion of the group 10 metal to a location that inhibits void formation.

When the group 10 metal is formed as a layer, e.g., the layer 430, the group 10 metal layer may be formed as a continuous layer or a discontinuous layer. A continuous layer 430 has no, or very few, openings therein through which the layer 420 may directly contact the layer 410. In some cases, the minimum thickness that results in a continuous layer is used. In some cases, the minimum thickness is about 10 nm, but may vary depending on the particular group 10 metal. Below the minimum thickness, a discontinuous layer 430 may result, which may include numerous openings therein, or may include islands of the group 10 metal. In some embodiments, the layer 430 is such a discontinuous layer. In such embodiments, the group 10 metal of the discontinuous layer may diffuse during operation under the influence of driving forces (e.g., elevated temperature, bonding stress) to produce a continuous or discontinuous group 10 metal layer within an Au/Al IMC region, e.g., formed by the bonding process. Such a layer may be detected by, e.g., SEM, TEM, EDS, XPS, or similar analytic techniques.

Figure 5:
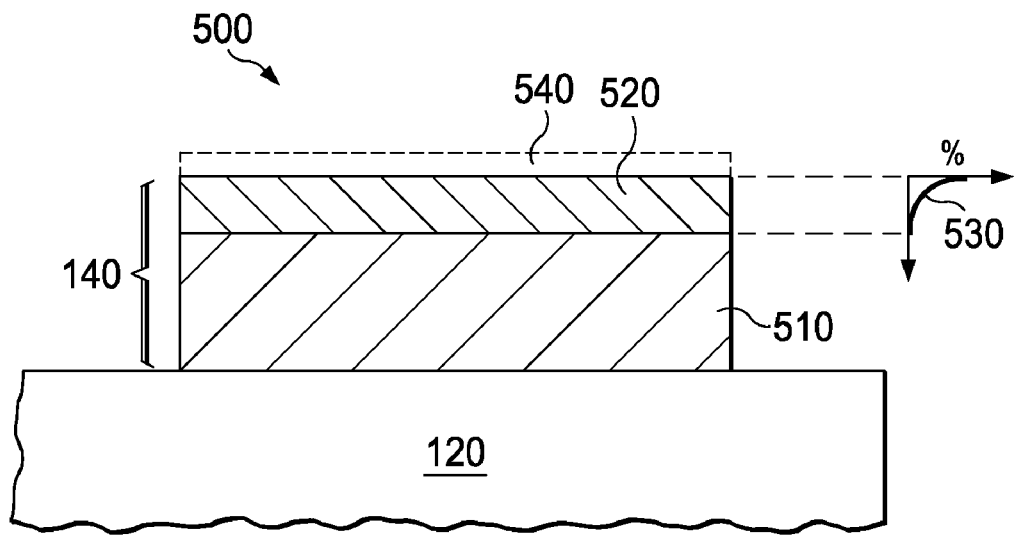
FIG. 5 illustrates a bond pad of the disclosure in which a layer including Al and a group 10 metal is located at an upper surface of the bond pad.

FIG. 5 illustrates an embodiment generally designated 500 in which a bond pad 140 includes a layer 510 that is essentially free of a group 10 metal and a layer 520 that includes a group 10 metal. The concentration of the group 10 metal decreases with increasing depth into the layer 520, as qualitatively illustrated by a concentration profile 530. Such a profile maybe produced, e.g., by depositing a layer 540 of a group 10 metal onto the surface of the layer 510 and thermally diffusing the layer 540 into the layer 510. In the embodiment 500, the upper surface of the layer 520 is an alloy of Al and the group 10 metal, as distinguished from some conventional bond pad structures that include an Al-free Pd upper surface. In some embodiments the concentration of the group 10 metal may be at between about 50 wt % and about 95 wt % at the surface of the layer 520.

The layer 540 may be, e.g. less than about 100 nm. In some cases, the layer 540 is discontinuous, or may be noncontiguous islands. The group 10 metal may be diffused into the layer 510 at a temperature close to, but below, the melting point of Al, e.g., about 660 C. The bond pad 140 may then be formed by conventional pattern and etch as described previously. In some cases, etching the metal stack may be done by employing a multi-step plasma or wet etch process.

Alternately, an Al layer over a semiconductor wafer may be patterned first to form the layer 510. The layer 540 may then be deposited over the full wafer and diffused into the layer 510, forming the alloy layer 520 over the layer 510. The undiffused layer 540 present over the remaining wafer, e.g., the substrate 120, can then be removed in a manner that does not significantly affect the bond pad 140. In one example, after the group 10 metal is diffused into the layer 510, the group 10 metal may be removed by a nonselective process such as a sputter etch or a $Ar/SF_6$ plasma etch. While some of the bond pad 140 may be removed, the amount of material lost would not significantly affect the bond pad 140 performance. Moreover, sufficient group 10 metal is expected to remain in the bond pad 140, conferring the advantages discussed herein. In another example, a wet etch may be used to remove the group 10 metal from the substrate 120 after diffusion. A brief etch in, e.g., 3:1 $HNO_3$:HCl is expected to remove the thin undiffused group 10 metal layer, while having a small affect on the bond pad 140. Those skilled in the art are capable of determining specific process conditions for the particular group 10 metal and layer 540 thickness.

In the embodiment 500, the interface between the layer 520 and the layer 510 may not be distinct. For example, the concentration of the group 10 metal may smoothly decrease from a peak concentration at or near the surface of the bond pad 140 with depth into the bond pad 140. In this case, the thickness of the layer 520 is regarded as the thickness at which the concentration of the group 10 metal decreases to about 10% of its peak value in the layer 520.

Each of the layers 310, 430, 520 may be viewed as a source of the group 10 metal to diffuse in the bond pad 140 as the bond pad 140 ages. It is expected that at operating temperature over the lifetime of the electronic device 100 the atoms of the group 10 metal will be sufficiently mobile that they will diffuse to the location within the bond pad 140 that decreases the free energy of the thermodynamic system of the regions associated with the bond pad 140 and the wire 150. The concentration of the group 10 metal is expected to suppress void formation as previously described, but without the necessity of providing Pd in the wire 150.

Figure 6:
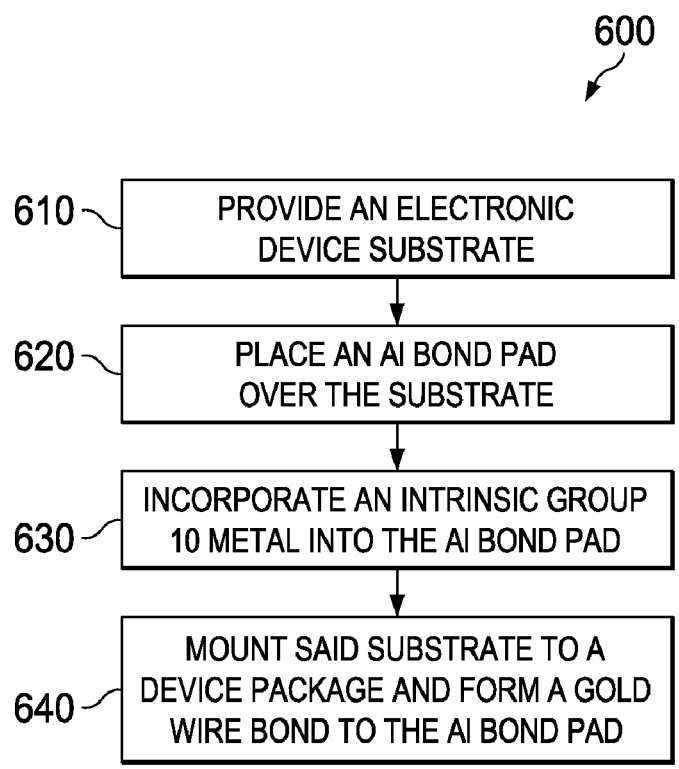
FIG. 6 illustrates a method of the disclosure.

Turning now to FIG. 6, illustrated is a method of the disclosure, generally designated 600. The method 600 begins with a step 610, in which an electronic device substrate is provided. Herein and in the claims, "provided" means that a device, substrate, structural element, etc., may be manufactured by the individual or business entity performing the disclosed methods, or obtained thereby from a source other than the individual or entity, including another individual or business entity.

In a step 620, an Al bond pad is placed over the device substrate. The bond pad may be formed, e.g., in a manner previously described with respect to the bond pad 140. In a step 630, an intrinsic group 10 metal is incorporated into the bond pad. The group 10 metal may have an average concentration in the bond pad in a range of about 0.1 wt % to about 35 wt %, as previously described. The layer may be formed such that the surface of the bond bad has between about 50 wt % and about 95 wt % of the group 10 metal. The group 10 metal may be, e.g., Pd. In some embodiments, the layer that includes the group 10 metal may be an Al layer, wherein the Al layer is formed with a homogeneously distributed concentration of the group 10 metal therein. In other embodiments, the layer that includes the group 10 metal may be a layer embedded within the Al bond pad.

In some embodiments the method 600 continues with a step 640, in which an Au wire is bonded to the Al bond pad. The wire may be a 4N wire, as previously described. The bonding forms an Au/Al IMC region between the wire and the bond pad. The IMC region may optionally contact the peak concentration of the group 10 metal.

Those skilled in the art to which this application relates will appreciate that other and further additions, deletions, substitutions and modifications may be made to the described embodiments.

What is claimed is:

1. An electronic device, comprising:
   a substrate;
   a bond pad located over said substrate, said bond pad including:
      a first aluminum layer;
      a second aluminum layer located between said first aluminum layer and said substrate, and
      a metal layer comprising one or more of Ni, Pd and Pt located between said first and second aluminum layers, said metal layer having a total concentration of Ni, Pd and/or Pt of at least about 50 wt. %, and
   a gold wire bonded to said first aluminum layer.

2. The electronic device as recited in claim 1, wherein said first layer includes an intermetallic region that includes intermetallic compounds of aluminum and gold.

3. The electronic device recited in claim 1, wherein said first aluminum layer has a thickness in a range from about 10 nm to about 200 nm.

4. The electronic device as recited in claim 1, wherein said metal layer has a thickness in a range between about 10 nm and about 200 nm.

5. The electronic device recited in claim 1, wherein said bond pad comprises said Ni, Pd and/or Pt with an average total concentration in a range from about 0.1 wt % to about 35 wt %.

6. The electronic device recited in claim 1, wherein said bond pad comprises said Ni, Pd and/or Pt with an average total concentration in a range from about 0.5 wt % to about 12 wt %.

7. The electronic device recited in claim 1, wherein said bond pad comprises said Ni, Pd and/or Pt with an average total concentration in a range from about 1 wt % to about 8 wt %.

8. The electronic device recited in claim 1, wherein said metal layer is essentially free of Ni and Pt.

9. The electronic device recited in claim 1, further comprising a device package to which said substrate is mounted, wherein said gold wire connects a package pad of said device package to said bond pad.

10. The electronic device as recited in claim 1, wherein said metal layer is a substantially pure layer of Ni, Pd or Pt.

11. The electronic device as recited in claim 1, wherein said gold wire has a concentration of gold of at least about 99.99 wt. %.

12. The electronic device recited in claim 1, wherein said metal layer is essentially free of Ni and Pd.

13. The electronic device recited in claim 1, wherein said metal layer is essentially free of Pd and Pt.

14. An electronic device, comprising: a substrate; a bond pad located over said substrate, said bond pad including: a first aluminum layer; a second aluminum layer located between said first aluminum layer and said substrate; and a metal layer comprising Pd and/or Pt located between said first and second aluminum layers, wherein said metal layer has a total concentration of Pd and/or Pt of at least about 50 wt. %.

15. The electronic device as recited in claim 14, further comprising a gold wire bonded to said bond pad.

16. The electronic device as recited in claim 15, wherein said gold wire has a concentration of gold of at least about 99.99 wt. %.

17. The electronic device recited in claim 15, further comprising a device package to which said substrate is mounted, wherein said gold wire connects a package pad of said device package to said bond pad.

18. The electronic device recited in claim 14, wherein said metal layer is essentially free of Pt.

19. The electronic device recited in claim 14, wherein said metal layer is essentially free of Pd.

20. The electronic device as recited in claim 14, wherein said first layer includes an intermetallic region that includes intermetallic compounds of aluminum and gold.

21. The electronic device recited in claim 14, wherein said first aluminum layer has a thickness in a range from about 10 nm to about 200 nm.

22. The electronic device as recited in claim 14, wherein said metal layer has a thickness in a range between about 10 nm and about 200 nm.

23. The electronic device recited in claim 14, wherein said bond pad comprises said Pd and/or Pt with an average total concentration in a range from about 0.1 wt % to about 35 wt %.

24. The electronic device recited in claim 14, wherein said bond pad comprises said Pd and/or Pt with an average total concentration in a range from about 0.5 wt % to about 12 wt %.

25. The electronic device recited in claim 14, wherein said bond pad comprises said Pd and/or Pt with an average total concentration in a range from about 1 wt % to about 8 wt %.

26. The electronic device recited in claim 14, wherein said metal layer further comprises Ni.

27. The electronic device recited in claim 26, wherein said metal layer has a total concentration of Ni, Pd and/or Pt of at least about 50 wt. %.

* * * * *